United States Patent [19]

Gupta et al.

[11] Patent Number: 4,845,354

[45] Date of Patent: Jul. 4, 1989

[54] PROCESS CONTROL FOR LASER WIRE BONDING

[75] Inventors: Arunava Gupta, Valley Cottage; Brian W. Hussey, Garrison, both of N.Y.

[73] Assignee: International Business Machines Corporation, Armonk, N.Y.

[21] Appl. No.: 165,319

[22] Filed: Mar. 8, 1988

[51] Int. Cl.$^4$ ............................................. B23K 26/00
[52] U.S. Cl. ................................. 250/205; 219/121.62
[58] Field of Search ............................... 250/201, 205; 219/121.60, 121.61, 121.62, 121.63

[56] References Cited

U.S. PATENT DOCUMENTS 3,485,996  12/1969  Chiou et al. ..................... 219/121.62
4,420,260  12/1983  Martinelli .

FOREIGN PATENT DOCUMENTS 0041089  4/1981  Japan .
0174289  10/1984  Japan ............................. 219/121.61

OTHER PUBLICATIONS

Roshon, Jr.; "Laser Modulation Control Method"; IBM Technical Disclosure Bulletin; vol. 12, No. 3, Aug. 1969; p. 485.

Primary Examiner—Edward P. Westin
Attorney, Agent, or Firm—Philip J. Feig

[57] ABSTRACT

An optical process monitor primarily for use in laser wire bonding detects the reflectivity change of the wire being bonded in order to provide feedback control of the high power laser used for bonding the wire to a pad. A low power laser beam which is co-linear or combined with the high power laser beam is conducted to the bond site and reflected from the wire during the bonding cycle. The change in reflectivity of the wire during the bonding cycle is detected from the reflected low power laser beam. A signal commensurate with the detected change of reflectivity is used to control the power or duration of the high power laser during bonding.

32 Claims, 4 Drawing Sheets

PROCESS CONTROL FOR LASER WIRE BONDING

BACKGROUND OF THE INVENTION

This invention relates to laser wire bonding and more specifically relates to an optical process monitor including a feedback control mechanism by which the reflectivity change of a wire being bonded is used for controlling the laser process parameters during laser wire bonding.

Laser wire bonding has been used in the past to join metal workpieces to each other and specifically in electronic circuit packaging for joining contact pads with fine wires or ribbons.

The bonding process involves providing laser energy through an optical fiber to a capillary bonding tip. The laser energy heats up the tip and under the combined influence of the localized heating and applied pressure urging the wire into intimate contact with the pad, the wire bonds to the pad. One such apparatus for use in practicing the laser bonding process is described in U.S. Pat. No. 4,534,811, issued to N. G. Ainslie et al, entitled "Apparatus for Thermo Bonding Surfaces" and assigned to the same assignee as the present application.

Since the bonding process is dependent upon the thermal effects caused by the laser energy, it is important to control certain variables or parameters of the laser energy, such as the power level and duration of the applied energy. Excessive heating can result in excessive melting of the wire or in cracks due to thermal stress in the ceramic substrate supporting the contact pad. Insufficient heating will result in poor bonding. Since the thermal environment of the pads may vary from one location on the substrate to another, it is not always possible to obtain adequate bonding of all the pads at different locations using a predetermined laser power level and laser pulse duration. For example, when bonding wires to pads disposed on a glass ceramic substrate, twice as much energy is required when bonding to a pad located directly above a via compared to bonding to a pad not over a via. The energy difference is a result of the heat sinking effect of the high thermal conductivity copper found in the via. Since the via location under a pad is not often well defined, it is important to have a monitor to control the laser energy for bonding at different pad locations.

Previous methods of bond monitoring include the use of a thermocouple sensor which measures the instantaneous temperature at the bond site. Such an arrangement is described in the article "Discrete Wire Bonding Using Laser Energy" by P. Chalco et al, Proceedings of the 1987 International Symposium on Microelectronics, Sept. 28-30, 1987, pages 435 et seq.

SUMMARY OF THE INVENTION

The reflectivity of most metals decreases steadily with increasing temperature until an abrupt decrease is observed at the melting point. In the present invention, the reflectivity change of the wire during bonding occurring due to both the temperature change and the change in the shape of the wire during melting is monitored. The monitored wire reflectivity is processed as a feedback control for the laser used for the laser wire bonding. The use of such real time monitor permits the proper bonding of pads at all locations on the substrate.

A principal object of the present invention is therefore, the provision of reflectivity monitoring for providing feedback control in a laser wire bonding apparatus.

Another object of the invention is the provision of a reflectivity monitor in a laser wire bonding apparatus for providing a feedback signal to control process parameters of a laser used for wire bonding.

Still other objects of the invention will become more clearly apparent when the following specification is read in conjunction with the accompanying drawings.

DETAILED DESCRIPTION

Figure 1:
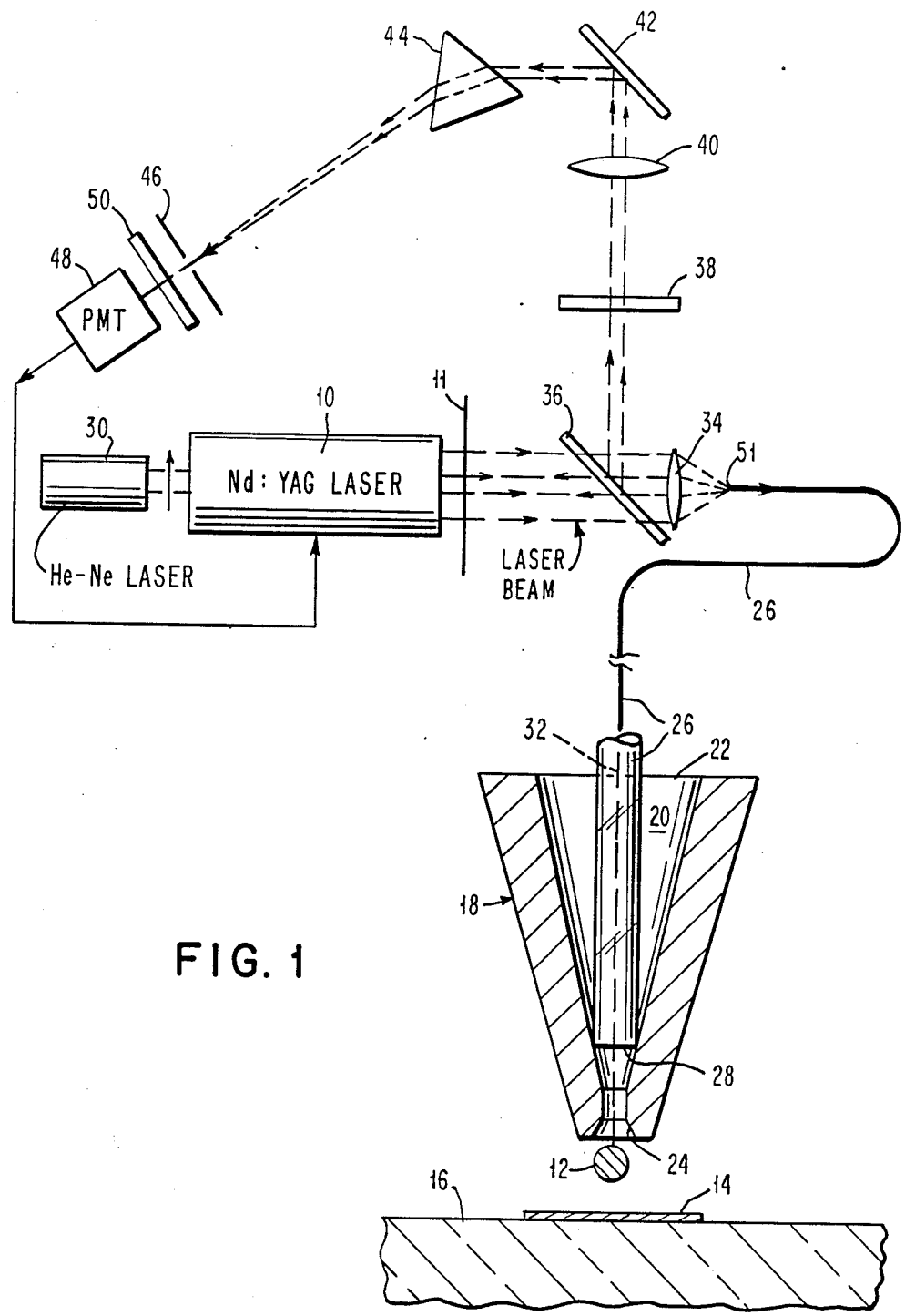
FIG. 1 is a schematic representation of an arrangement for detecting reflected laser radiation during laser wire bonding.

Referring now to the figures and to FIG. 1 in particular, there is shown a Nd:YAG laser 10 (hereafter sometimes referred to as a YAG laser) use for bonding wire 12 to a pad 14 disposed on substrate 16. Typically, the wire 12 is 50 microns diameter copper wire coated with a 2000Å layer of gold and the pad 14 is a 0.2 micron gold/nickel pad. The laser, in a preferred embodiment, operates at a wavelength of 1.06 micron and at a continuous power level in the range between 20 and 40 watts. Other high power pulsed or continuous wave laser may be substituted for bonding the wire such as Ar-ion, $CO_2$, Cu vapor, and the like lasers.

As described in the patent to Ainslie et al, supra, a tungsten bonding tip 18 is shown having a central bore 20. The bore 20 is tapered from a larger entrance aperture 22 to an exit bore 24. The tip end or exit bore 24 is shaped to conform to the general dimension of the wire 12. The tip 18 travels in the vertical direction as shown for urging the wire under an applied pressure into intimate contact with pad 14. The heat necessary to bond wire 12 to pad 14 is generated by a black body cone formed by the tapered portion of the bore 20 which absorbs the incident laser beam energy transmitted through optical fiber 26 into the tip 18, thereby raising the temperature of the tip end portion 24. Alternatively, the laser energy may be transmitted directly from the fiber 26 to the wire 12 as shown by the dashed line 32 in tip 18 of FIG. 1. The combination of the applied pressure and generated heat bonds the wire to the pad.

The bonding is a thermal process making control of the laser 10 parameters important for assuring proper bonding between the wire 12 and the pad 14.

While it is possible to measure the reflectivity of the YAG laser beam, the background signal due to reflection from the end 28 of the optical fiber 26 and the relatively large tip size make observation of small changes in the reflected signal difficult resulting in the need for an alternative measurement technique.

A preferred alternative technique requires the use of a low power He—Ne laser 30 operating at a wavelength different from the wavelength of the YAG laser. In a preferred embodiment the laser 30 operates at a wavelength of 633 nm. The beam path from laser 30 is co-linear with the YAG laser beam or is combined with the YAG laser beam by use of a cold mirror as shown in conjunction with the embodiment per FIG. 3 described hereinafter. The reflectivity change of the He—Ne laser beam is monitored during bonding, since a larger change of signal is observed with the reflected 633 nm beam than with the reflected YAG laser beam. It will be apparent to those skilled in the art that any low power visible laser or infrared laser which reflects from the bonded wire may be used in place of the He—Ne laser 30.

The YAG laser 10 transmits a beam of laser energy through a beam shutter 11, through beam splitter 36 and lens 34 into an optical fiber 26. The optical fiber propagates the laser energy into the bonding tip 18 in proximity to the exit 24 of the tip and to the wire 12 to be bonded to pad 14.

The laser 30 transmits a linearly polarized beam at a continuous wave power level in the order of 5 milliwatt co-linear with the YAG laser beam through optical fiber 26. The laser beam, shown by dashed line 32 in the tip 18 is reflected from the wire 12 as a non-polarized beam and propagates through the fiber 26 in the direction opposite that of the laser beam providing the energy to bond the wire. After the reflected beam is collimated passing through lens 34, a portion of the beam is deflected by the beam splitter 36. The deflected beam travels through a crossed polarizer 38 and another focusing lens 40 to a mirror 42 whereat the beam is reflected to a prism 44 where the low power laser beam is spatially separated from the YAG laser beam and is focussed through an iris 46 onto a silicon photodetector 48 or a photomultiplier tube. The output signal from the photodetector or photomultiplier tube is commensurate with the amplitude of the reflected low power laser beam and is hereafter referred to as the reflectance signal. The photomultiplier tube has a very low sensitivity for 1.06 micron radiation. A He—Ne line filter 50 may be disposed in the beam path in front of the photodetector 48 in order to filter any scattered YAG laser radiation.

The crossed polarizer 38 in the He—Ne laser beam path nulls the polarized beam reflected from the front end 51 of fiber 26 causing a significant reduction of the background signal. Moreover, the amplitude of the non-polarized beam reflected from end 28 of fiber 26 is reduced in half by the polarizer 38.

Figure 2:
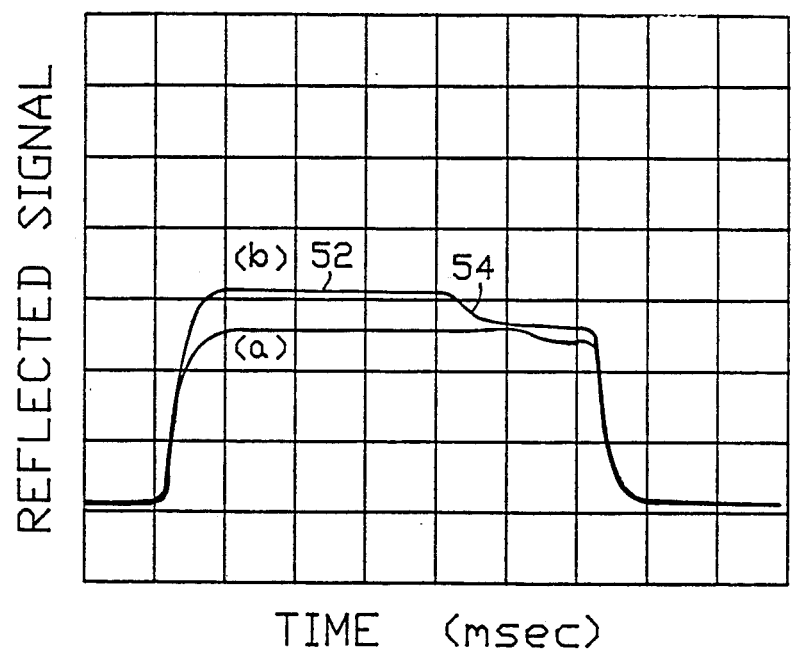
FIG. 2 is a graphical representation of reflected laser beams during the wire bonding process when using the arrangement per FIG. 1.

FIG. 2 illustrates the waveform of the reflected signals when using the embodiment per FIG. 1. In FIG. 2, trace (a) illustrates the signal detected by the photodetector 48 with the bonding tip 18 not in contact with the wire 12. Trace (b) illustrates the reflectance signal with the tip 18 in contact with the wire 12 and the YAG laser transmitting 40 watts of power in 60 msec pulses.

The signal shown in trace 2(a), generated in the absence of any contact between the tip end 24 and the wire 12, results from the background signal due to the He—Ne beam being reflected from the end 28 of fiber 26 and from the narrow end 24 of the tip 18. The signal shown in trace 2(b) is the combination of the laser beam being reflected from the wire 12 and the background signal. It will be apparent to those skilled in the art that the change in reflectivity of the wire 12 during bonding is clearly visible and hence measurable. The increase in signal level due to the reflected signal remains substantially constant (region 52) until the melting point of the wire is achieved, after which point there is a relatively sharp decrease in the amplitude of the signal (region 54).

Figure 3:
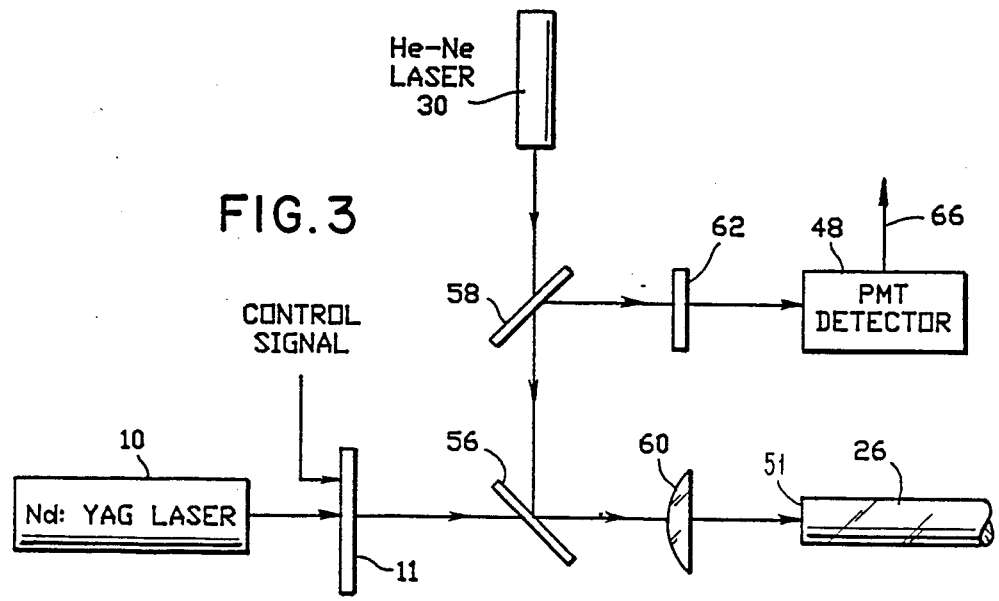
FIG. 3 is a schematic representation of an alternative arrangement for practicing the invention.

In an alternative preferred embodiment shown in FIG. 3, a Nd:YAG laser 10 transmits laser energy through a shutter 11. The opening of shutter 11 is controlled by a control signal responsive to the reflectance signal or by a predetermined time duration control signal provided, for instance, from a personal computer as will be described in conjunction with FIG. 5. The laser beam passing through shutter 11 travels through a cold mirror 56. Concurrently, a He—Ne laser 30 transmits a low power laser beam through a beam splitter 58 to the cold mirror 56 whereat the laser beam from YAG laser 10 and the laser beam from He—Ne laser 30 are combined. The combined beams pass through lens 60 and enter optical fiber 26. The beams propagate along fiber 26 to and from bonding tip 18 generally as described in conjunction with the embodiment per FIG. 1. Alignment of the two laser beams is facilitated by the arrangement shown in FIG. 3.

The returning reflected laser beam exits optical fiber 26, travels through lens 60, is reflected at cold mirror 56 and beam splitter 58. The beam then travels through polarizer 62 which eliminates the signal reflected from the front end 51 of the optical fiber. The beam passing through polarizer 62 is detected by photodetector 48. The reflectance signal is provided along conductor 66 for processing as a feedback control signal for shutter 11 or in an alternative arrangement, for controlling the power from YAG laser 10.

Figure 4:
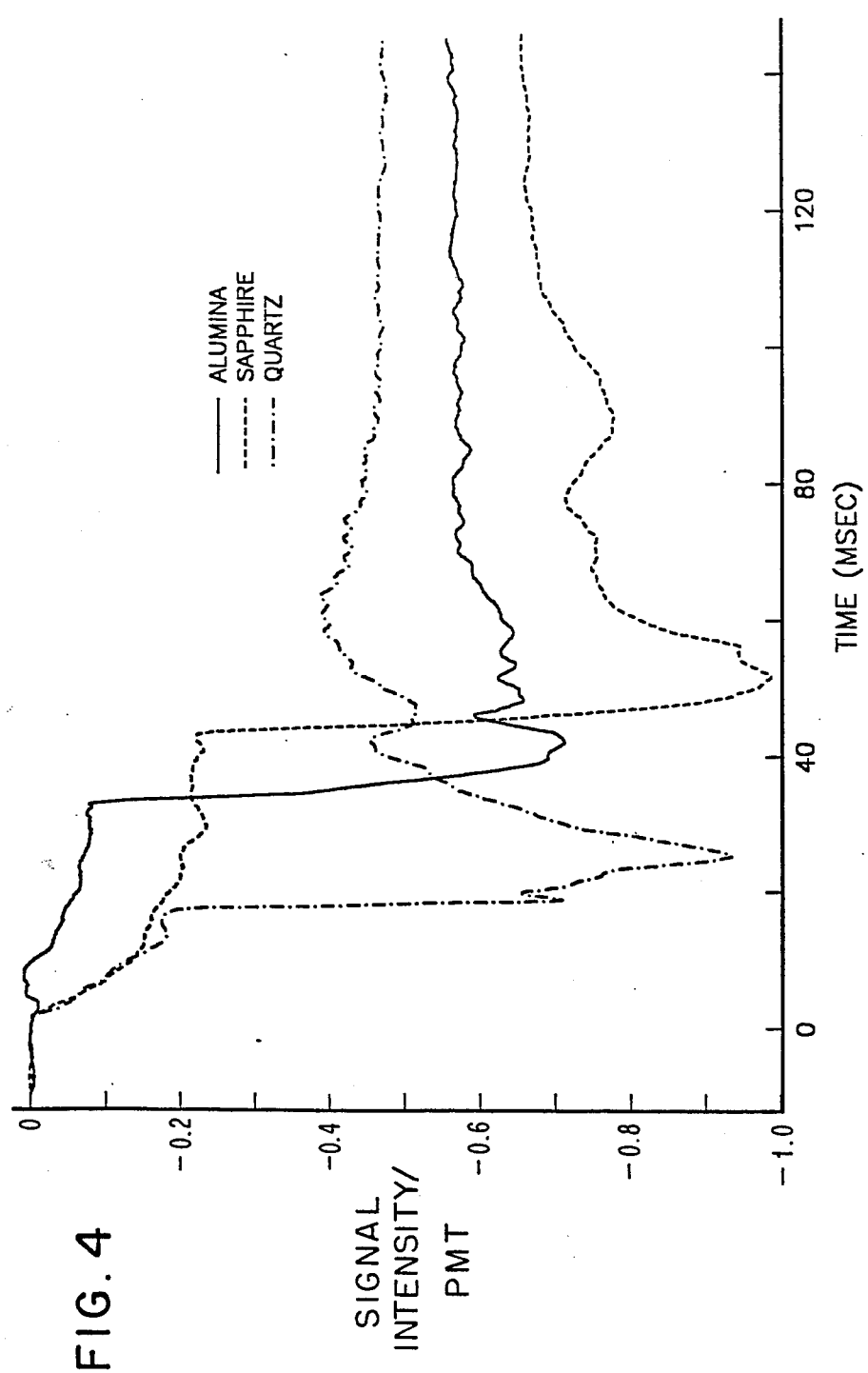
FIG. 4 is a graphical representation of reflected laser beams during the wire bonding process when using the arrangement per FIG. 3.

FIG. 4 illustrates the waveforms of the reflected signals when using the preferred embodiment per FIG. 3. The waveforms represent results with alumina, sapphire and quartz substrates each having the same thickness layer of gold on the surface to which the wire is bonded. In each case, the same bonding laser power is applied. As contrasted with the waveforms in FIG. 2, the decrease of signal amplitude at melting is much more pronounced and much simpler to detect. It will be apparent to those skilled in the art, that a wire bonded to a quartz substrate, which is a relatively poor thermal conductor, will melt sooner than a wire bonded to a better thermal conductor, such as an alumina or sapphire substrate.

In tests with alumina based substrates, it has been observed that in order to achieve adequate bonding, the YAG laser preferably should provide laser energy for 20 to 30 milliseconds after surface melting of the wire is detected. In order to accomplish the adjustment of the YAG laser 10 "on" time, the reflectance signal along conductor 66 is fed to a computer for processing using data acquisition and appropriate software as described below. Upon detection of the onset of melting of the wire 12 at each different pad location, the computer will, after a preset time interval, cause shutter 11 to close thereby interrupting the beam from YAG laser 10. The described arrangement in FIG. 5 assures adequate bonding independent of the thermal environment of the pad location. In a similar manner, the YAG laser 10 power can be controlled during the bonding cycle as described in conjunction with FIG. 6. It will be apparent to those skilled in the art that the monitoring and control of laser 10 is achievable by the use of software.

Figure 5:
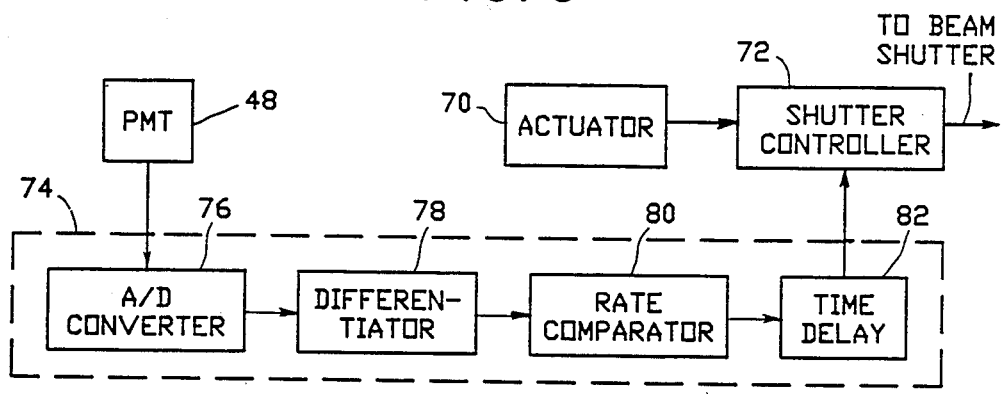
FIG. 5 is a schematic representation of a circuit arrangement for providing time duration control of a laser during laser wire bonding.

In the arrangement shown in FIG. 5, the YAG laser beam pulse width duration is controlled by the opening and closing of a shutter 11 disposed in front of the laser 10, in the path of the laser beam in FIG. 3.

A signal from actuator 70 to shutter controller 72 commences the bonding process. The actuator 70 may be a manual pushbutton start switch, an automatic actuator responsive to a sensor sensing that parts to be joined are in proper position or any other known actuator used in laser wire bonding.

During the bonding process as described above in conjunction with FIG. 3, the photomultiplier tube 48 monitors the reflected He—Ne laser light on a continuous basis, providing a real time analog signal to the time controller circuit 74. The time controller circuit in a preferred embodiment is a suitably programmed DAC card contained in a personal computer. The reflectance signal from photomultiplier tube 48 is provided via conductor 66 to an analog-to-digital converter 76 where the signal is sampled at a 2 KHz rate. It has been observed that the differentiated reflectance signal is a more useful indicator of the onset of melting than the reflectance signal itself. Therefore, the output signal from analog-to-digital converter 76 is provided to the input of a differentiator 78 which provides at its output signal a first order time derivative of the input signal, also at a 2KHz rate. The differentiated output signal from differentiator 78 is provided to a rate comparator circuit 80 which provides a start signal to time delay circuit 82 when the upper limit of the comparator is reached. The time delay circuit is settable depending upon YAG laser power and typically is variable from 0 to 50 milliseconds. Upon completion of the time delay, a stop signal is provided to shutter controller 72 to close the shutter 11 or otherwise impede the laser beam. There is also provided a conventional timer circuit (not shown) which will provide a stop signal after a predetermined time period, which time period exceeds the expected controlled time period, in the event that no change in signal from photomultiplier tube 48 is detected and measured by the time controller circuit 74.

The elements described above in conjunction with the time controller circuit 74 are well known to those skilled in the art of designing suitable hardware and of programming suitable software.

Figure 6:
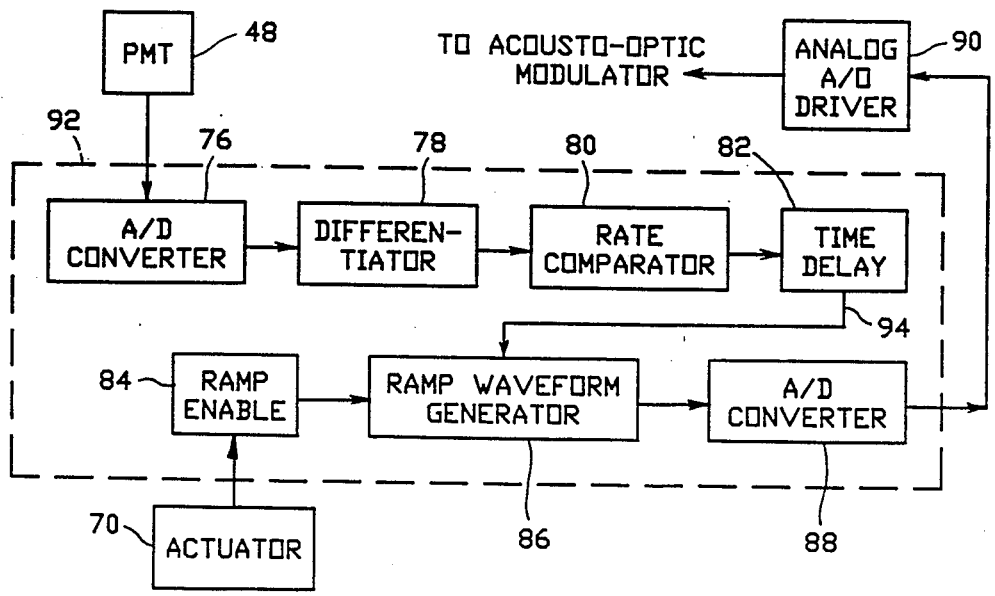
FIG. 6 is a schematic representation of a circuit arrangement for providing power level control of a laser during laser wire bonding.

FIG. 6 shows a preferred embodiment for a power-controlled laser arrangement. The elements common to those found in FIG. 5 are identified with the same reference numerals and perform the same function as described above in conjunction with the description of FIG. 5. In the embodiment per FIG. 6, an acousto-optic modulator driver 90 is substituted for the shutter controller 72 in order to control the YAG laser 10. Similarly, an acousto-optic modulator is substituted for the shutter 11 shown in FIGS. 1 and 3.

The bonding process commences when a start signal from actuator 70 is provided to a ramp enable circuit 84 which, in turn, provides an enable signal to ramp waveform generator 86. The ramp waveform generator 86, responsive to the enable signal, generates a positive going ramp waveform signal having a preprogrammed slope or rise rate. The ramp waveform signal from generator 86 is provided to a digital-to-analog converter 88. The digital-to-analog converter 88 provides a converted analog signal, commensurate with the ramp waveform signal, to an analog acousto-optic driver 90. The driver 90, during bonding time, causes the acousto-optic modulator (not shown) to allow the YAG laser 10 beam to travel through the laser wire bonding system generally as described in connection with FIG. 1. In the power controller circuit 92, after the time delay circuit 82 completes its delay time, a signal is provided along conductor 94 to the ramp waveform generator 86 for causing the generator 86 to provide a negative going ramp waveform output signal to the digital-to-analog converter 88. The digital-to-analog converter 88 provides the converted signal to analog acousto-optic driver 90 which, in turn, causes the acousto-optic modulator to deflect the YAG laser 10 beam. In the described arrangement per FIG. 6 the YAG laser 10 is generating power continuously. Accordingly, the optical configuration comprising the acousto-optic modulator further includes a beam dump or beam load in line with the unused or blocked portion of the acousto-optic modulator diffraction pattern. The power of the laser beam is modulated responsive to the reflectance signal by virtue of the power controller circuit 92 and acousto-optic modulator.

It will be apparent to those skilled in the art that the embodiment shown in FIG. 6 is capable of construction either using conventional circuits or by the preferred means of programming.

While the reflectivity monitor described above was used in conjunction with assuring adequate wire bonding, there are many other applications where the general principle is applicable. For example, the same principle is applicable to control the laser ball tape process for tab automated bonding. Additionally, infrared radiation emitted from the heated area can be transmitted from the bond area through the optical fiber to an infrared detector for controlling a YAG laser.

In a further alternative application, the detected signal can be used to monitor the end 28 of the fiber 26 for wear or deterioration or for loss of polish at the fiber end. A different portion of the detected signal which is filtered in the embodiments described above is monitored for this purpose.

In a still further alternative application, the monitor is capable of detecting the thermal environment of wire. A wire bonded at or near its end region will dissipate heat in only one linear direction along its length. Another wire bonded in a center region, away from the end region, will dissipate heat in both linear directions along the length of wire. As a result of different thermal dissipation rates, the monitor is capable of detecting melting of a wire sooner when bonding occurs closer to an end region than to a center region. Such location monitoring is useful for multiple bonding with a single wire or for assuring that bonding occurs at a desired position along the length of a wire.

While there has been described and illustrated a feedback control for laser wire bonding using a reflectivity monitor, and several variations and modifications thereof, it will be understood by those skilled in the art that further modifications and variations are possible without deviating from the broad scope of the invention which shall be limited solely by the scope of the claims appended hereto.

What is claimed is:

1. A device for monitoring the energy dissipated during laser bonding of a metal workpiece to another workpiece comprising:
   first means for propagating a first beam of energy to the metal workpiece sufficient to bond the metal workpiece to the another workpiece;

second means for propagating a second beam of energy co-linearly with said first beam, said second beam being reflected from the metal workpiece in the bond region;

detection means disposed for detecting the reflected second beam and providing a reflectance signal commensurate with the reflected second beam, and control means coupled to said detection means for receiving said reflectance signal and controlling said first means responsive to said reflectance signal.

2. A device as set forth in claim 1, wherein said first means is a first laser means for bonding the workpieces and said second means is a second laser means operating at a lower power level than said first laser means and at a wavelength different from that of said first laser means.

3. A device as set forth in claim 2, wherein said detection means includes means for spatially separating said reflected second beam.

4. A device as set forth in claim 3, where said means for spatially separating is optical means.

5. A device as set forth in claim 3, wherein said detection means further includes conversion means for converting said spatially separated reflected second beam into an reflectance signal.

6. A device as set forth in claim 1, wherein said first means includes a shutter and said control means controls the time duration of said first beam by controlling said shutter.

7. A device as set forth in claim 1, wherein said first means includes an acousto-optic modulator means and said control means controls the power of said first beam by controlling said acousto-optic modulator means.

8. A device as set forth in claim 1, wherein said first beam and said second beam pass through a cold mirror for being propagated co-linearly.

9. A device as set forth in claim 2, wherein said second laser means is a visible light laser.

10. A device as set forth in claim 2, wherein said second laser means is an infrared laser.

11. A device as set forth in claim 1, wherein said control means controls a process parameter of said first means.

12. A device as set forth in claim 1, wherein the metal workpiece is a wire and the another workpiece is a pad.

13. A method of monitoring the energy dissipated during bonding of a metal workpiece to another workpiece by propagation of a first energy beam sufficient to bond the workpieces comprising the steps of:

propagating a second energy beam, co-linear with said first energy beam, for being reflected from the metal workpiece in the bond region during bonding;

detecting the reflected second energy beam; and controlling the first energy beam responsive to said reflected second energy beam.

14. A method as set forth in claim 13, wherein said first energy beam is a first laser beam and said second energy beam is a second laser beam operating at a lower power level than said first laser beam and at a wavelength different from that of said first laser beam.

15. A method as set forth in claim 13, wherein said second energy beam is a visible laser beam.

16. A method as set forth in claim 13, wherein said second energy beam is an infrared laser beam.

17. A method as set forth in claim 13, wherein said controlling of the first energy beam comprises controlling the time duration of said first energy beam.

18. A method as set forth in claim 17, wherein controlling the time duration of said first energy beam includes controlling shutter means disposed in the path of the first energy beam.

19. A method as set forth in claim 13, wherein said controlling the first energy beam comprises controlling the power of said first energy beam.

20. A method as set forth in claim 19, wherein controlling the power of said first energy beam includes controlling acousto-optic modulation means disposed in the path of the first energy beam.

21. A method as set forth in claim 13, wherein said detecting the reflected second beam includes spatially separating said reflected second beam.

22. A device for controlling the process parameters of a laser wire bonder while bonding a first metal workpiece to a second metal workpiece comprising:

first laser means for propagating a first laser beam for bonding a first workpiece to a second workpiece;

second laser means for propagating a second laser beam, co-linearly with said first laser beam, said second laser beam being reflected from the first workpiece in the bond region;

detection means for detecting the reflected second laser beam and providing a reflectance signal commensurate with the reflected second laser beam, and control means coupled to said detection means for receiving said reflectance signal and controlling said first laser beam responsive to said reflectance signal.

23. A device as set forth in claim 22, wherein said control means includes means for impeding said first laser beam responsive to said reflectance signal.

24. A device as set forth in claim 23, wherein said means for impeding includes shutter means.

25. A device as set forth in claim 23, wherein said means for impeding includes acousto-optic modulation means.

26. A device as set forth in claim 22, wherein said first laser beam operates at a higher power and different wavelength than said second laser beam.

27. A device as set forth in claim 22, wherein said detection means includes means for optically spatially separating said reflected second beam.

28. In a laser wire bonding apparatus for bonding a wire to a pad by use of a beam of high power laser energy at a first wavelength, a monitoring device for controlling the high power laser energy comprising:

laser means for propagating a beam of low power laser energy at a second wavelength, co-linearly with the beam of high power laser energy, for being reflected by the wire in the bond region during bonding;

detection means for detecting the reflected low power laser energy and providing a reflectance signal commensurate with the reflected low power laser energy; and control means for receiving said reflectance signal and controlling the beam of high power laser energy responsive to said reflectance signal.

29. An apparatus as set forth in claim 28, wherein said detection means includes means for optically spatially separating said reflected low power laser energy beam and electrical signal conversion means for converting said spatially separated reflected low power laser energy beam into a signal commensurate with the reflectivity of the wire.

30. An apparatus as set forth in claim 28, wherein said control means controls process parameters of the beam of high power laser energy.

31. An apparatus as set forth in claim 28, wherein said control means controls the duration of the beam of high power laser energy.

32. An apparatus as set forth in claim 28, wherein said control means controls the power of the beam of high power laser energy.

* * * * *